United States Patent  
Syu et al.

(10) Patent No.: US 9,135,166 B1
(45) Date of Patent: *Sep. 15, 2015

(54) SYSTEM AND METHOD FOR PERFORMING DATA RETENTION IN SOLID-STATE MEMORY UTILIZING COPY COMMANDS AND USAGE DATA

(71) Applicant: Western Digital Technologies, Inc., Irvine, CA (US)

(72) Inventors: Mei-Man L. Syu, Fremont, CA (US); Matthew Call, Ladera Ranch, CA (US); Ho-Fan Kang, Aliso Viejo, CA (US); Lan D. Phan, Laguna Hills, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/087,549

(22) Filed: Nov. 22, 2013

Related U.S. Application Data

(63) Continuation of application No. 12/824,434, filed on Jun. 28, 2010, now Pat. No. 8,612,669.

(51) Int. Cl.
*G06F 12/02* (2006.01)
*G11C 16/34* (2006.01)

(52) U.S. Cl.
CPC ........ *G06F 12/0246* (2013.01); *G11C 16/3418* (2013.01); *G11C 16/3431* (2013.01); *G06F 2212/1032* (2013.01); *G06F 2212/7209* (2013.01)

(58) Field of Classification Search
CPC ............ G06F 12/0246; G06F 2212/72; G06F 2212/2022; G06F 12/123; G06F 2212/1032; G06F 2212/7209; G11C 16/3418; G11C 16/3431; G11C 16/349

USPC ...................... 711/106, 103; 365/185.25, 222
See application file for complete search history.

(56) References Cited

U.S. PATENT DOCUMENTS 5,625,791 A 4/1997 Farrugia et al.
5,724,285 A 3/1998 Shinohara
(Continued)

OTHER PUBLICATIONS

Office Action dated Dec. 27, 2012 from U.S. Appl. No. 12/824,434, Syu et al, filed Jun. 28, 2010, 22 pages.
(Continued)

*Primary Examiner* — Sanjiv Shah
*Assistant Examiner* — Glenn Gossage
(74) *Attorney, Agent, or Firm* — McDermott Will & Emery LLP

(57) ABSTRACT

Systems and methods for retaining data in non-volatile solid-state memory are disclosed in which refresh copy operations are performed on data stored in non-volatile solid-state memory. A controller can comprise a data retention module configured to issue copy commands within different periods of time and to maintain usage data on a storage subsystem. A refresh copy operation helps ensure that data written to memory retain integrity by causing data to be programmed again onto the memory. Execution of refresh copy commands may be prioritized over other commands based on a remaining length of time. One or more data structures may be used to determine memory blocks that require refresh copy operations. In one embodiment, a validity bit array is used to track blocks that contain valid data. In another embodiment, a least recently used list is used to track blocks that have been least recently written.

19 Claims, 10 Drawing Sheets

(56) References Cited

U.S. PATENT DOCUMENTS

| | | | |
|---|---|---|---|
| 5,768,193 A | 6/1998 | Lee et al. | |
| 6,240,032 B1 | 5/2001 | Fukumoto | |
| 7,325,090 B2 | 1/2008 | Ronen | |
| 7,532,532 B2 * | 5/2009 | Schreck et al. | 365/222 |
| 7,565,479 B2 * | 7/2009 | Best et al. | 711/106 |
| 7,594,066 B2 * | 9/2009 | Watanabe et al. | 711/103 |
| 7,870,330 B2 | 1/2011 | Swaminathan | |
| 8,164,967 B2 | 4/2012 | Byom et al. | |
| 8,243,525 B1 | 8/2012 | Kan | |
| 8,612,669 B1 | 12/2013 | Syu et al. | |
| 2006/0288153 A1 | 12/2006 | Tanaka et al. | |
| 2008/0189489 A1 | 8/2008 | Mitra | |
| 2008/0239811 A1 | 10/2008 | Tanaka | |
| 2009/0043947 A1 * | 2/2009 | Tringali et al. | 711/103 |
| 2009/0161466 A1 * | 6/2009 | Hamilton et al. | 365/222 |
| 2009/0198879 A1 | 8/2009 | Tanaka | |
| 2010/0217919 A1 | 8/2010 | Sukegawa et al. | |

OTHER PUBLICATIONS

Notice of Allowance dated Aug. 16, 2013 from U.S. Appl. No. 12/824,434, Syu et al, filed Jun. 28, 2010, 10 pages.

Sridharan et al., "Reducing Data Cache Susceptibility to Soft Errors." IEEE Transactions on Dependable and Secure Computing, vol. 3, No. 4, Oct.-Dec. 205, pp. 353-364.

* cited by examiner

230

| Blk | Bit |
|-----|-----|
| 0 | 0 |
| 1 | 0 |
| 2 | 0 |
| 3 | 0 |
| 4 | 0 |
| 5 | 0 |
| ... | ... |

212
"Current"

| Blk | Bit |
|-----|-----|
| 0 | 0 |
| 1 | 0 |
| 2 | 0 |
| 3 | 0 |
| 4 | 0 |
| 5 | 0 |
| ... | ... |

214
"Next"

232

| Blk | Bit |
|-----|-----|
| 0 | 0 |
| 1 | 0 |
| 2 | 1 |
| 3 | 0 |
| 4 | 1 |
| 5 | 0 |
| ... | ... |

212
"Current"

| Blk | Bit |
|-----|-----|
| 0 | 0 |
| 1 | 0 |
| 2 | 0 |
| 3 | 0 |
| 4 | 0 |
| 5 | 0 |
| ... | ... |

214
"Next"

234

| Blk | Bit |
|-----|-----|
| 0 | 0 |
| 1 | 0 |
| 2 | 1 |
| 3 | 0 |
| 4 | 1 |
| 5 | 0 |
| ... | ... |

212
"Current"

⇒ Copy

| Blk | Bit |
|-----|-----|
| 0 | 0 |
| 1 | 0 |
| 2 | 1 |
| 3 | 0 |
| 4 | 1 |
| 5 | 0 |
| ... | ... |

214
"Next"

236

| Blk | Bit |
|-----|-----|
| 0 | 0 |
| 1 | 0 |
| 2 | 1 |
| 3 | 0 |
| 4 | 1 |
| 5 | 0 |
| ... | ... |

212
"Next"

| Blk | Bit |
|-----|-----|
| 0 | 1 |
| 1 | 1 |
| 2 | 0 |
| 3 | 0 |
| 4 | 1 |
| 5 | 1 |
| ... | ... |

214
"Current"

238

| Blk | Bit |
|-----|-----|
| 0 | 0 |
| 1 | 0 |
| 2 | 1 |
| 3 | 0 |
| 4 | 1 |
| 5 | 0 |
| ... | ... |

212
"Next"

| Blk | Bit |
|-----|-----|
| 0 | 1 |
| 1 | 0 |
| 2 | 0 |
| 3 | 0 |
| 4 | 0 |
| 5 | 1 |
| ... | ... |

214
"Current"

240

| Blk | Bit |
|-----|-----|
| 0 | 1 |
| 1 | 0 |
| 2 | 1 |
| 3 | 0 |
| 4 | 0 |
| 5 | 1 |
| ... | ... |

212
"Next"

⇐ Copy

| Blk | Bit |
|-----|-----|
| 0 | 1 |
| 1 | 0 |
| 2 | 1 |
| 3 | 0 |
| 4 | 0 |
| 5 | 1 |
| ... | ... |

214
"Current"

| Blk | Bit |
|---|---|
| 0 | 0 |
| 1 | 0 |
| 2 | 0 |
| 3 | 0 |
| 4 | 0 |
| 5 | 0 |
| ... | ... |

212
"Current"

| Blk | Bit |
|---|---|
| 0 | 0 |
| 1 | 0 |
| 2 | 0 |
| 3 | 0 |
| 4 | 0 |
| 5 | 0 |
| ... | ... |

214
"Next"

436

| Blk | Bit |
|---|---|
| 0 | 0 |
| 1 | 0 |
| 2 | 1 |
| 3 | 0 |
| 4 | 1 |
| 5 | 1 |
| ... | ... |

212
"Next"

| Blk | Bit |
|---|---|
| 0 | 0 |
| 1 | 0 |
| 2 | 0 |
| 3 | 0 |
| 4 | 1 |
| 5 | 1 |
| ... | ... |

214
"Current"

432

| Blk | Bit |
|---|---|
| 0 | 0 |
| 1 | 0 |
| 2 | 0 |
| 3 | 0 |
| 4 | 0 |
| 5 | 0 |
| ... | ... |

212
"Current"

| Blk | Bit |
|---|---|
| 0 | 0 |
| 1 | 0 |
| 2 | 0 |
| 3 | 0 |
| 4 | 1 |
| 5 | 1 |
| ... | ... |

214
"Next"

438

| Blk | Bit |
|---|---|
| 0 | 0 |
| 1 | 0 |
| 2 | 1 |
| 3 | 0 |
| 4 | 1 |
| 5 | 0 |
| ... | ... |

212
"Next"

| Blk | Bit |
|---|---|
| 0 | 0 |
| 1 | 0 |
| 2 | 0 |
| 3 | 0 |
| 4 | 1 |
| 5 | 1 |
| ... | ... |

214
"Current"

434

| Blk | Bit |
|---|---|
| 0 | 0 |
| 1 | 0 |
| 2 | 0 |
| 3 | 0 |
| 4 | 1 |
| 5 | 1 |
| ... | ... |

212
"Current"
⇓
"Next"

⇐ Copy

| Blk | Bit |
|---|---|
| 0 | 0 |
| 1 | 0 |
| 2 | 0 |
| 3 | 0 |
| 4 | 1 |
| 5 | 1 |
| ... | ... |

214
"Next"
⇓
"Current"

440

| Blk | Bit |
|---|---|
| 0 | 0 |
| 1 | 0 |
| 2 | 0 |
| 3 | 0 |
| 4 | 1 |
| 5 | 1 |
| ... | ... |

212
"Next"
⇓
"Current"

⇒ Copy

| Blk | Bit |
|---|---|
| 0 | 0 |
| 1 | 0 |
| 2 | 0 |
| 3 | 0 |
| 4 | 1 |
| 5 | 1 |
| ... | ... |

214
"Current"
⇓
"Next"

FIGURE 3A

SYSTEM AND METHOD FOR PERFORMING DATA RETENTION IN SOLID-STATE MEMORY UTILIZING COPY COMMANDS AND USAGE DATA

RELATED APPLICATION

This application is a continuation of U.S. application Ser. No. 12/824,434 (now U.S. Pat. No. 8,612,669), filed on Jun. 28, 2010 and titled "SYSTEM AND METHOD FOR PERFORMING DATA RETENTION IN SOLID-STATE MEMORY," the disclosure of which is hereby incorporated by reference in its entirety.

BACKGROUND

Non-volatile solid-state memory stores data, at the hardware level, by retaining electrons at individual floating gates within memory cells. The electrons are placed into the floating gates by a current applied during a program cycle. If a floating gate in the programmed state is left un-programmed for a long time, some of the electrons may leak out of the floating gate and cause bit errors.

BRIEF DESCRIPTION OF THE DRAWINGS

Systems and methods which embody the various features of the invention will now be described with reference to the following drawings, in which:

FIG. 2A illustrates an example of using validity bit arrays in a data retention operation in accordance with one embodiment.

FIG. 3A illustrates another example of using validity bit arrays in a data retention operation in accordance with one embodiment.

DETAILED DESCRIPTION

While certain embodiments of the invention have been described, these embodiments have been presented by way of example only, and are not intended to limit the scope of the invention. Indeed, the novel methods and systems described herein may be embodied in a variety of other forms. Furthermore, various omissions, substitutions and changes in the form of the methods and systems described herein may be made without departing from the spirit of the invention. The accompanying claims and their equivalents are intended to cover such forms or modifications as would fall within the scope and spirit of the inventions.

Overview

Embodiments of the invention are directed to systems and methods for retaining data in solid-state memory in which refresh copy operations are performed on data stored in solid-state memory. A refresh copy operation helps ensure that data written to memory retain integrity by causing data to be programmed again onto the memory, which minimizes the aforementioned risk of data error caused by electron leak. One or more data structures may be used to determine memory blocks that require refresh copy operations. For example, in one embodiment, a validity bit array is used to track blocks that contain valid data. In another embodiment, a least recently used list is used to track blocks that have been least recently written.

System Overview

Figure 1A:
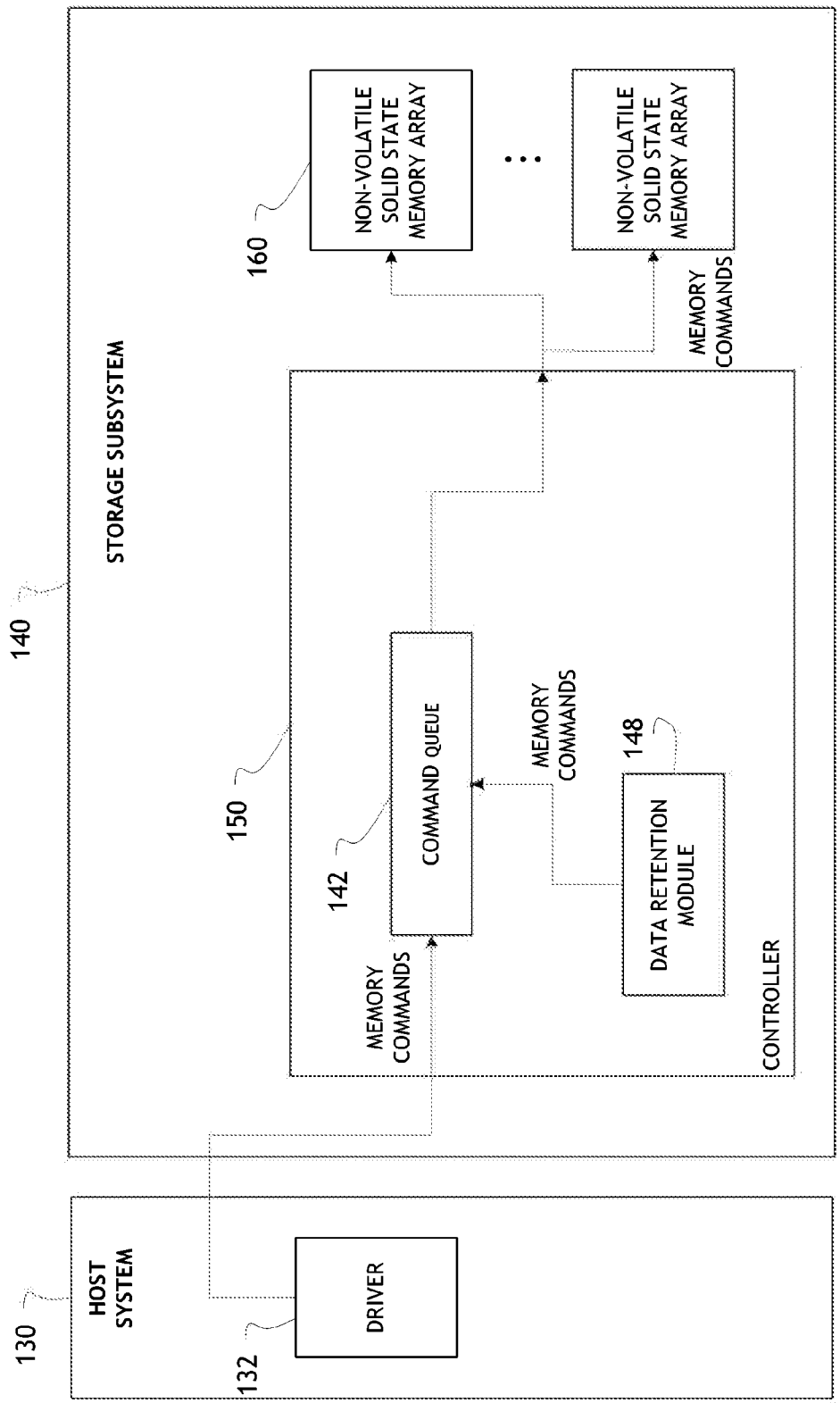
FIG. 1A is a block diagram illustrating a solid-state storage subsystem according to one embodiment.

FIG. 1A is a block diagram illustrating a storage subsystem embodiment with a data retention capability. As shown, a storage subsystem 140 includes a controller 150, which in turn includes a command queue 142 and a data retention module 148, which is configured to execute the data retention operations as further described below. In one embodiment, the host command queue 142 receives memory commands from a driver 132 residing within a host system 130, and the memory commands may include write and read commands issued by the host system 130. As further shown in FIG. 1A, in one embodiment, the controller 150 executes the commands in the host command queue 142 as well as commands issued by the data retention module 148 in one or more non-volatile solid-state memory arrays 160. The commands from the data retention module 148 may be stored in the queue 142 or in a separate queue. In the description below, for the sake of brevity, the data retention module 148 may be described as directly performing a memory operation on data in the array (e.g. copying) instead of providing a command for doing so.

Data Retention Operations

Figure 1B:
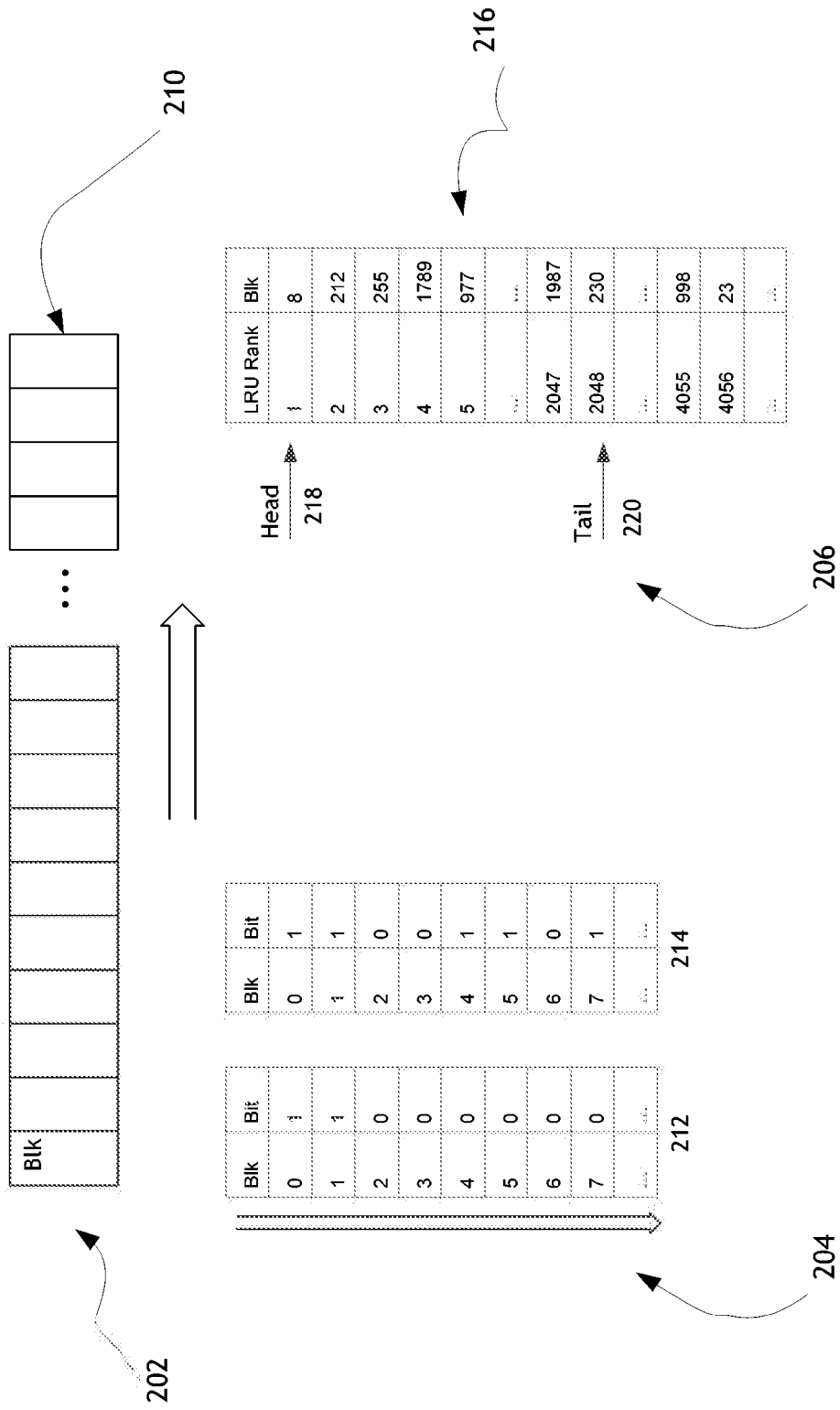
FIG. 1B illustrates data retention methods according to various embodiments.

FIG. 1B illustrates data retention methods according to various embodiments. Block diagram 202 shows a time-based embodiment in which blocks 210 within the non-volatile memory are sequentially refreshed on a periodic basis (i.e. by refreshing one or more blocks per refresh cycle) until all blocks are refreshed. The refresh cycle in one embodiment can be determined by dividing a refresh period by the number of blocks to be refreshed. In one embodiment, the refresh period can be set at three months, six months, one year, etc., as based on the manufacturer's specification and/or warranty of the memory. In one embodiment, the refresh copy commands are executed when the memory is idle (e.g. no host and/or garbage collection commands are executed). In one embodiment, the execution of refresh copy commands may be delayed as host commands and/or other internal commands (e.g. wear leveling commands) are prioritized by the controller over the refresh copy commands. In one embodiment, the pace of executing the refresh copy commands is adjusted in accordance with the progress of executing the refresh copy commands within the refresh period. For example, if the refresh period is three months and the refresh copy commands are not on track to finish within three months, the remaining refresh copy commands may be prioritized for execution.

Block diagram 204 shows a data retention embodiment that uses one or more validity bit arrays to track blocks that have valid data stored therein. In one embodiment, the data retention module 148 consults a validity bit array as it performs the data retention operation. As shown, each block has a validity bit entry in each array, with the bit set to "1" if the corresponding block contains valid data and "0" if it does not. In other embodiments, a "1" bit indicates invalid data and a "0" bit indicates valid data. In one or more embodiments, validity bit arrays 212 and 214 are used. The two-array embodiments allow the data retention module 148 to perform data retention operations based on the validity indications in one array while the other array is used to track new validity changes. The various data retention embodiments based on validity bit arrays will be further described below in conjunction with FIGS. 2A-2C and 3A-3C. In other embodiments, one validity bit array is used in the data retention operation.

Block diagram 206 shows a data retention embodiment that uses a table 216 that keeps track of the least recently used (written) blocks in the solid-state memory. In one embodiment, the table 216 lists blocks sorted by a least recently used (LRU) criterion. In one embodiment, each time a block is written, the entry corresponding to the written block is moved from its current position in the table 216 to the bottom of the table. In this manner, entries for blocks that are least recently used rise to the top, and other entries become sorted by a LRU criterion. In one embodiment, the data retention module 148 performs data retention on blocks referenced by entries between a head pointer 218 and a tail pointer 220. In one embodiment, the entry of the block that undergoes data retention is moved to the bottom of the table 216. In one embodiment, once data retention module 148 processes all the blocks between the head and the tail pointers, the head pointer is moved to the entry after the previous location of the tail pointer, and the tail pointer is moved to the end of the table. In other embodiments, other data structures such as a linked list can be used to keep track of the blocks sorted by the LRU criterion. The LRU-based data retention embodiment will be further described below in conjunction with FIGS. 4-5.

Validity Bit Array Embodiments

Figure 2B:
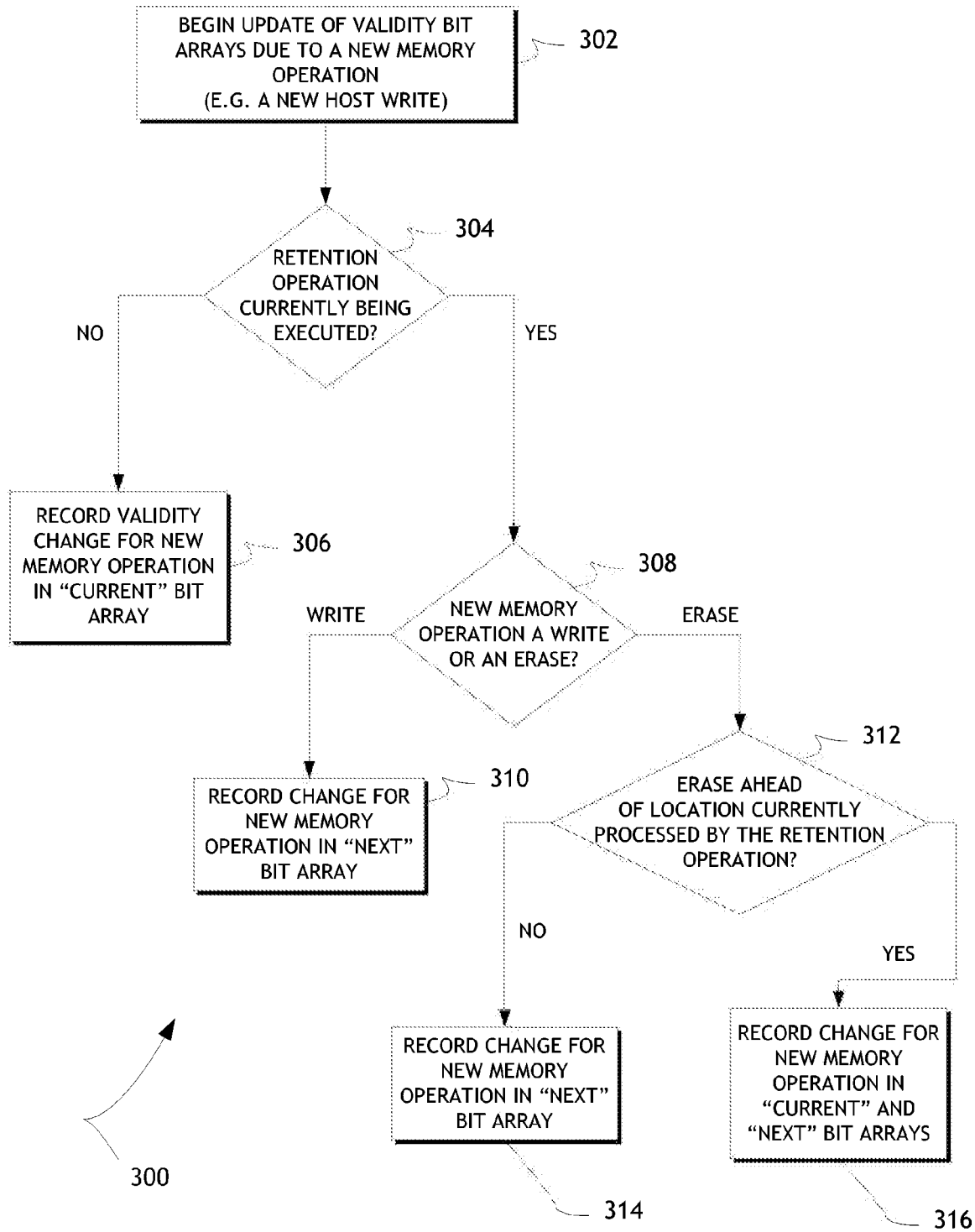
FIG. 2B is a flow diagram showing the process of updating the validity bit arrays in accordance with one embodiment.

FIG. 2A is a block diagram that illustrates an example of using validity bit arrays in a data retention operation in accordance with one embodiment, Scenario 230 illustrates an initialization phase with the array 212 (marked as the "current" array) and the array 214 ((marked as the "next" array). Scenario 232 shows that during a first refresh period, the "current" array 212 records indications of changes in the validity of the data in the blocks. In the example shown, each block has a validity bit entry in the array, with the bit set to "1" if the corresponding block contains valid data and "0" if it does not. In other embodiments, a "1" bit indicates invalid data and a "0" bit indicates valid data. The "next" array 214 in scenario 232 remains unchanged while the "current" array 212 is updated. Scenario 234 shows the arrays just before the start of the data retention operation. At the start of the operation, the data retention module 148 copies the contents of the "current" array 212 to the "next" array 214. The data retention module 148 then executes the data retention operation by consulting the "current" array 212. While the data retention operation is ongoing, the arrays record indications of changes in the validity of the data in accordance with the process shown in FIG. 2B. Scenario 236 shows the end of the data retention operation, and the arrays are switched, with the "current" array becoming the new "next" array and the "next" array becoming the new "current" array. Scenario 238 shows that new validity changes are recorded in the new "current" array until the next data retention operation. Scenario 240 shows the start of the next data retention operation, with the contents of the "current" array being copied to the "next" array and the data retention operation proceeding in accordance with the validity indications within the "current" array.

FIG. 2B is a flow diagram showing a process 300 performed by the data retention module 148 to update the validity bit arrays in accordance with one embodiment. In block 302, the process 300 is triggered by a new memory operation (e.g. a new host write or a garbage collection operation). Then in block 304, the process determines if the data retention operation is currently being executed. If not, the update process records the validity change caused by the new memory operation in the "current" bit array in block 306. If so, the process determines in block 308 if the new memory operation is a write operation or an erase operation. If it is a write operation, the update process records the validity change caused by the new operation in the "next" bit array in block 310. If it is an erase operation, the process further determines in block 312 if the location of the block to be erased is ahead of the location currently being processed by the data retention operation. If not, the update process records the validity change caused by the new memory operation in the "next" bit array in block 314. If so, the update process records the validity change caused by the new memory operation in the "current" and "next" bit arrays in block 316. As stated above, since a new erase operation makes the data in the block invalid, recording the validity change in the "current" array prevents the pending data retention operation from needlessly refreshing invalid data.

Figure 2C:
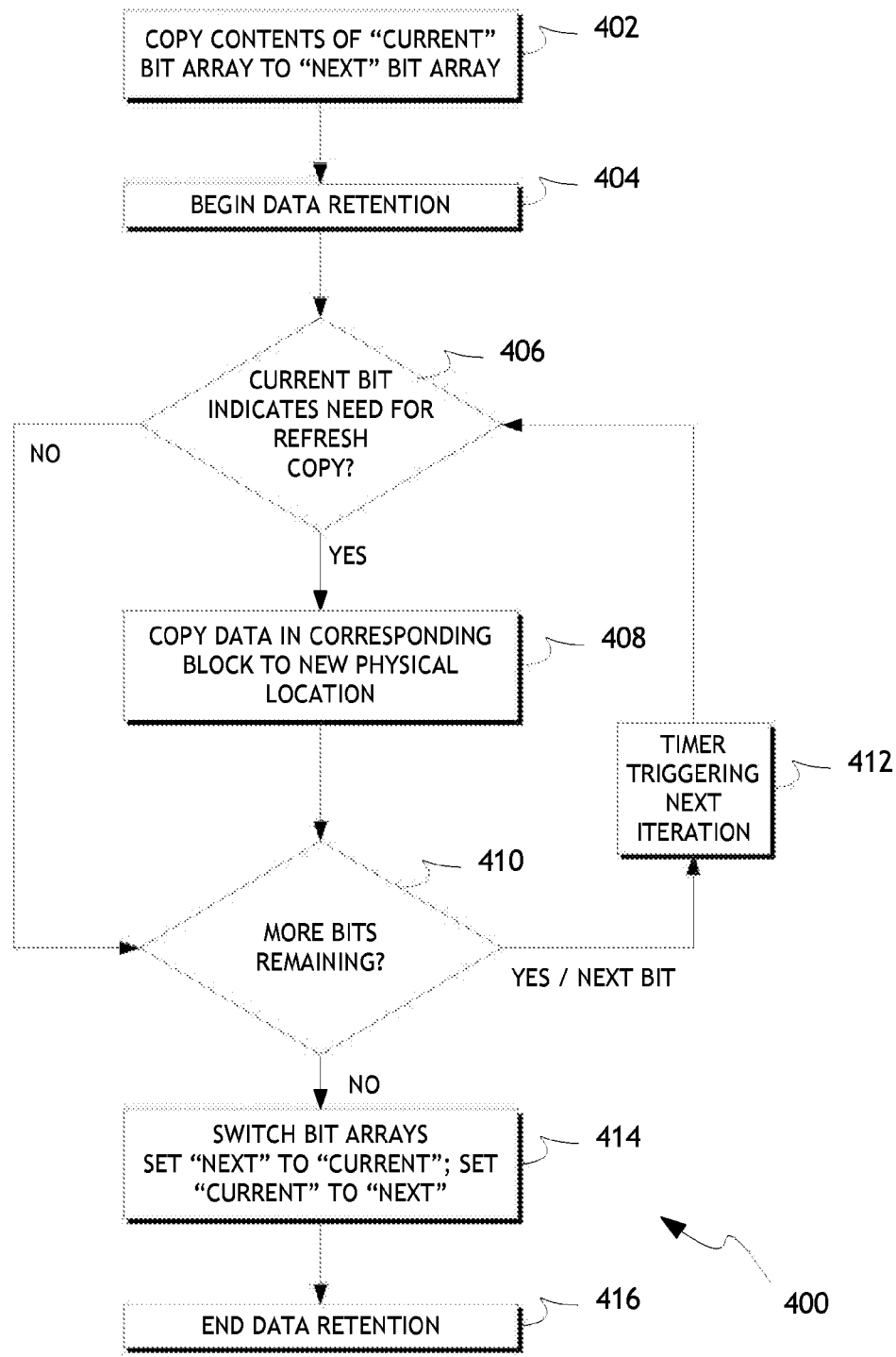
FIG. 2C is a flow diagram showing the process of using the validity bit arrays in the data retention operation in accordance with one embodiment.

FIG. 2C is a flow diagram showing a process 400 performed by the data retention module 148 that uses the validity bit arrays in the data retention operation in accordance with one embodiment. In block 402, the process begins by copying contents of the "current" bit array to the "next" bit array. In block 404, the data retention operation begins, and the "current" bit array entries are consulted to determine if refresh operations (copy operations) are needed for the individual blocks. In block 406, the process determines if the current bit in the array indicates valid data in the referenced memory block and a need for a refresh copy. If so, data in the referenced memory block are copied to a new physical block in block 408. If not, the process moves to block 410. In block 410, the process checks if there are additional bits remaining in the array. If so, it moves to consult the next bit in block 406. Optionally, a timer is used in block 412 to trigger the next iteration of operation to ensure that the refresh copy operation is performed on a periodic basis. In one embodiment, each refresh cycle is timed to ensure all refresh operations for the blocks complete within a time period set in accordance with a manufacturer warranty and/or specification. The time period can be for example, three months, six months, one year, etc. After all the bits are consulted in the "current" array and it is determined that there are no more bits remaining at block 410, the bit arrays are switched so the "current" array becomes the "next" array and vice versa at block 414. The data retention operation ends in block 416.

Figure 3B:
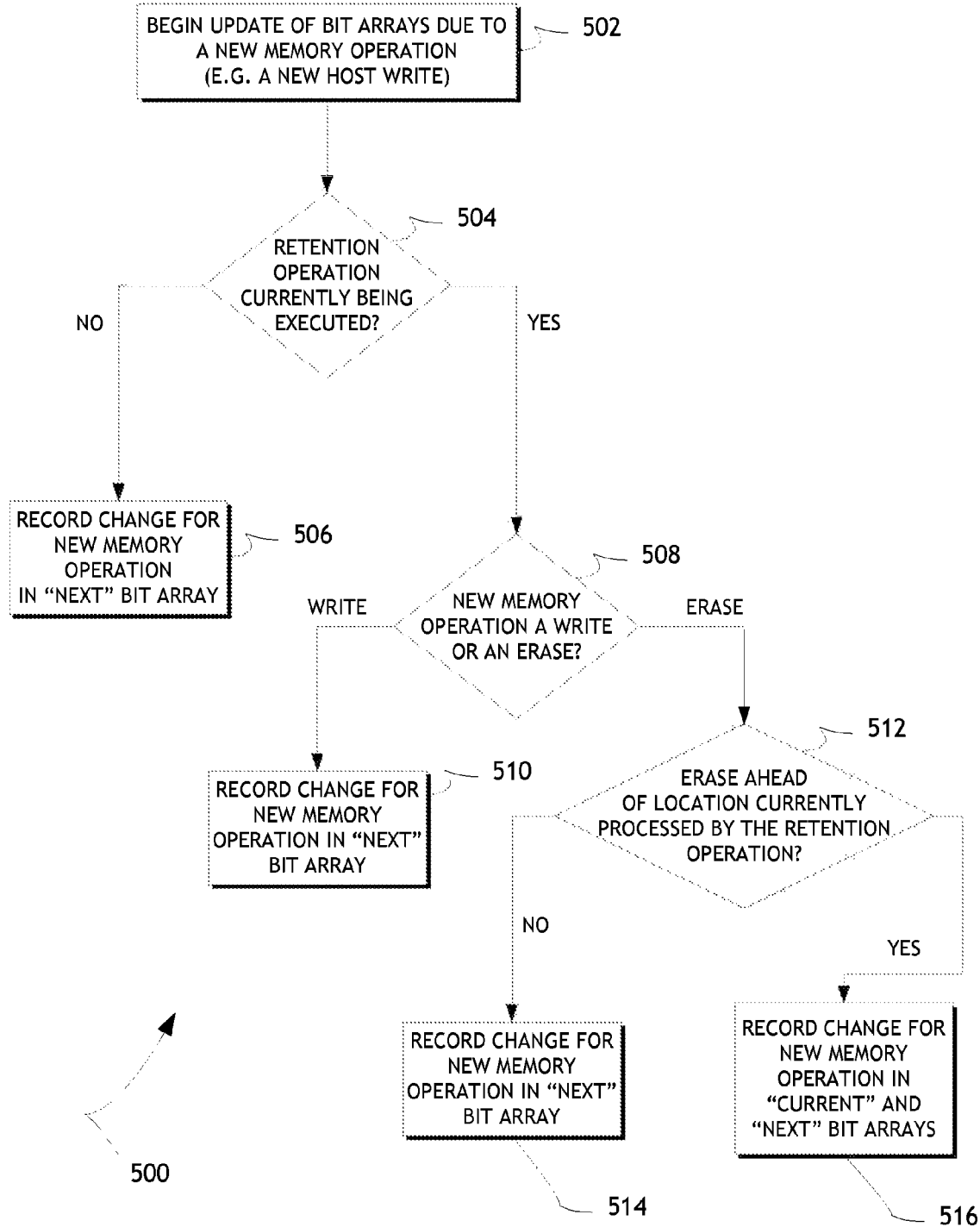
FIG. 3B is a flow diagram showing the process of updating the validity bit arrays in accordance with another embodiment.

FIG. 3A is a block diagram that illustrates another example of using validity bit arrays in a data retention operation in accordance with one embodiment. Scenario 430 illustrates an initialization phase with the array 212 (marked as the "current" array) and the array 214 (marked as the "next" array). Scenario 432 shows that during a first refresh period, the "next" array 214 records indications of changes in the validity of the data in the blocks. The "current" array 212 in scenario 432 remains unchanged while the "next" array 214 is updated. Scenario 434 shows the arrays just before the start of the data retention operation. At the start of the operation, the data retention module 148 copies the contents of the "next" array 214 to the "current" array 212, and then switches the two arrays by making array 212 the "next" array and array 214 the "current" array. The data retention module 148 then executes the data retention operation by consulting the "current" array 212. While the operation is ongoing, the arrays record indications of changes in the validity of the data in accordance with the process shown in FIG. 3B. Scenario 436 shows the arrays at the end of the data retention operation. Scenario 438 shows that new validity changes are recorded in the "next" array 212 until the next data retention operation. Scenario 440 shows the start of the next data retention operation, in which the data retention module 148 again performs the copying and switching of arrays as previously shown in scenario 434 prior to executing the data retention operation.

FIG. 3B is a flow diagram showing a process 500 performed by the data retention module 148 to update the validity bit arrays in accordance with one embodiment. In block 502, the process 500 is triggered by a new memory operation (e.g. a new host write or a garbage collection operation). Then in block 504, the process determines if the data retention operation is currently being executed. If not, the update process records the validity change caused by the new memory operation in the "next" bit array in block 506. If so, the process determines in block 508 if the new memory operation is a write operation or an erase operation. If it is a write operation, the update process records the validity change caused by the new operation in the "next" bit array in block 510. If it is an erase operation, the process further determines in block 512 if the location of the block to be erased is ahead of the location currently being processed by the data retention operation. If not, the update process records the validity change caused by the new memory operation in the "next" bit array in block 514. If so, the update process records the validity change caused by the new memory operation in the "current" and "next" bit arrays in block 516.

Figure 3C:
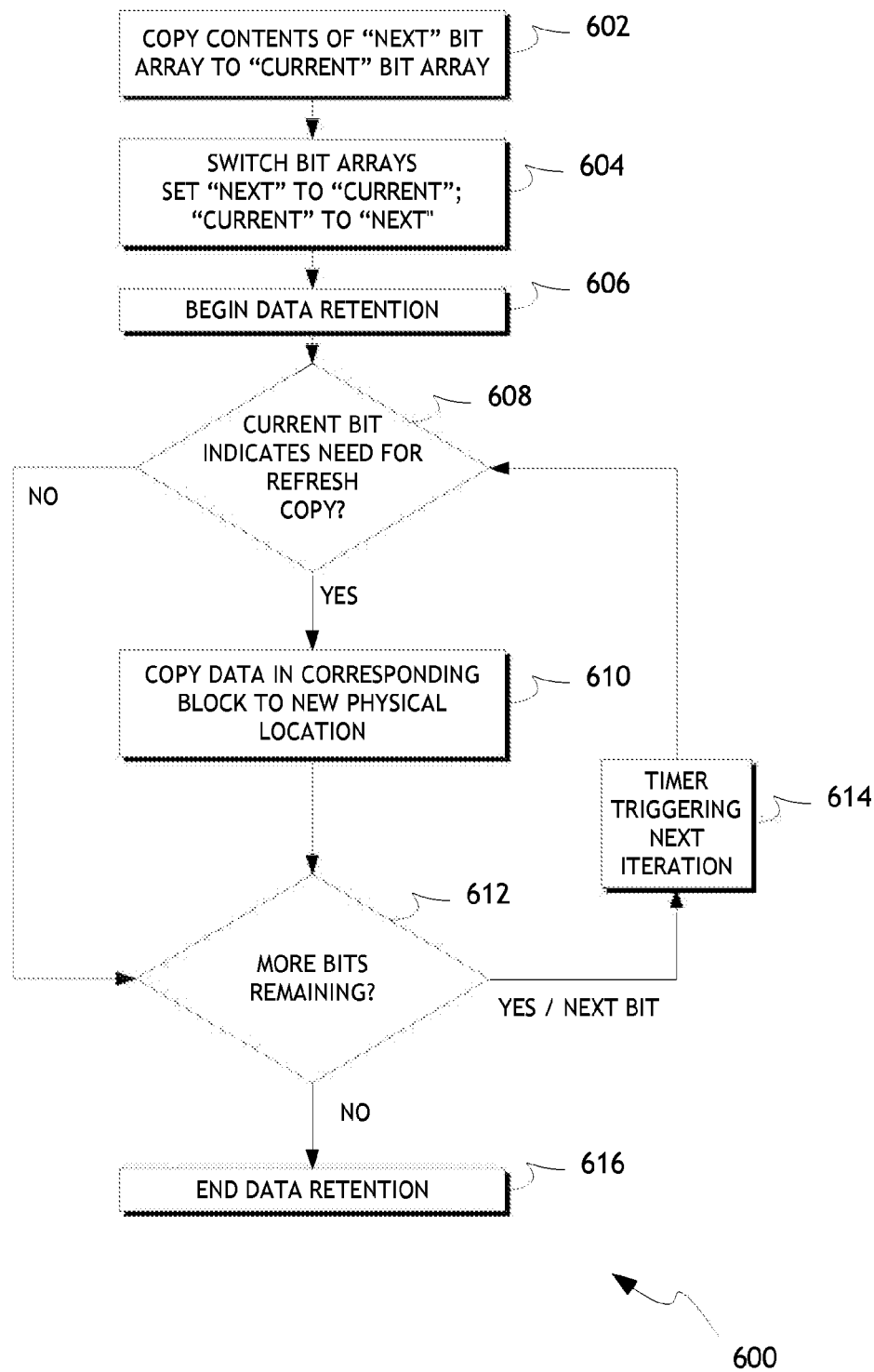
FIG. 3C is a flow diagram showing the process of using the validity bit arrays in the data retention operation in accordance with another embodiment.

FIG. 3C is a flow diagram showing a process 600 performed by the data retention module 148 that uses the validity bit arrays in the data retention operation in accordance with one embodiment. In block 602, the process begins by copying contents of the "next" bit array to the "current" bit array. In block 604, the arrays are switched so the "next" array becomes the "current" array and vice versa. In block 606, the data retention operation begins, and the "current" bit array entries are consulted to determine if refresh operations (copy operations) are needed for the individual blocks. In block 608, the process determines if the current bit in the array indicates a need for a refresh copy in the referenced memory block. If so, data in the referenced memory block are copied to a new physical block in block 610. If not, the process moves to block 612. In block 612, the process checks if there are additional bits remaining in the array. If so, it moves to consult the next bit in block 608. As with the process shown in FIG. 2C, optionally, a timer is used in block 614 to trigger the next iteration to ensure that the refresh copy operation is performed on a periodic basis. After all the bits are consulted in the "current" array, the data retention operation ends in block 616.

Least Recently Used Based Embodiment

Figure 4:
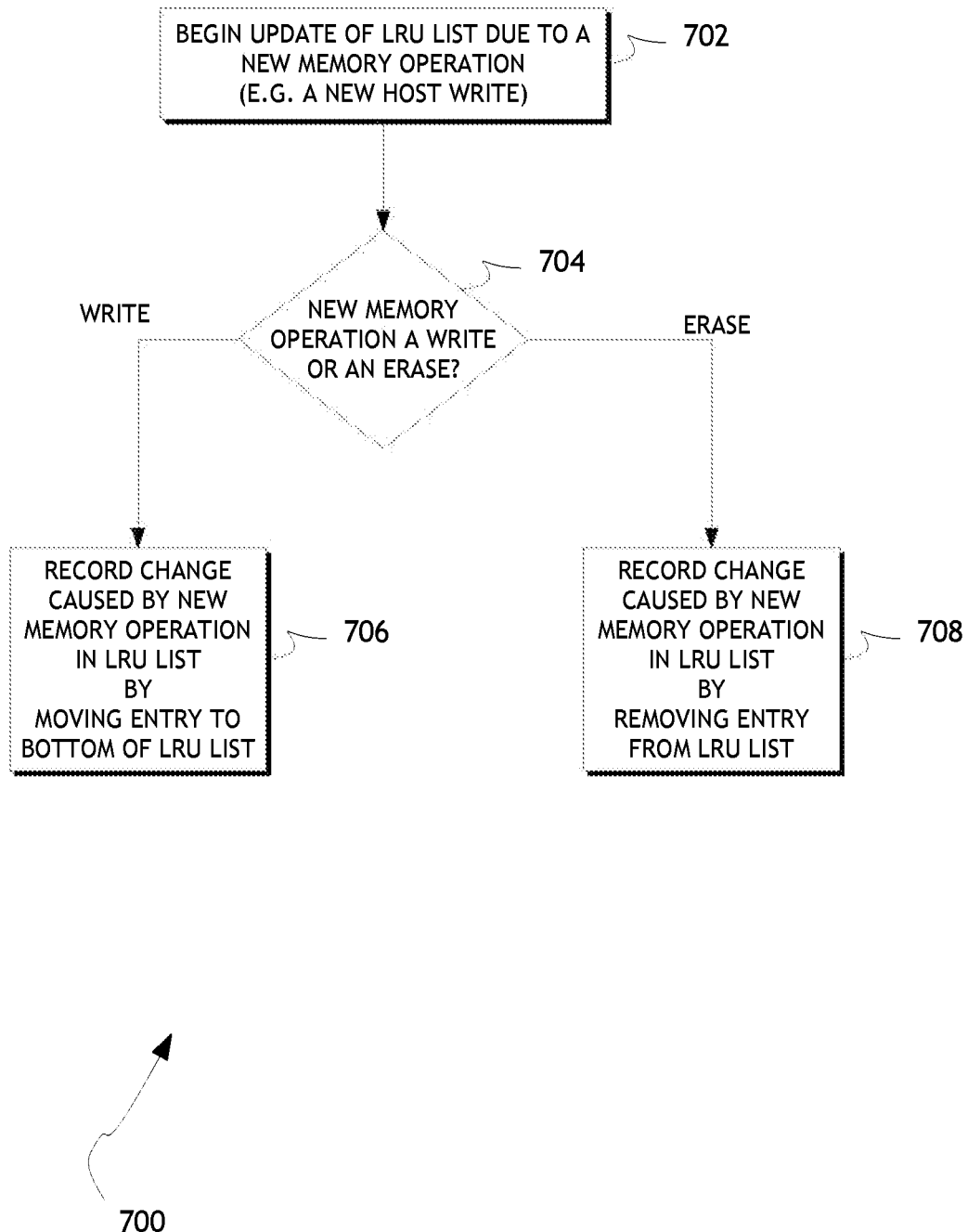
FIG. 4 is a flow diagram illustrating a process of updating a least recently used list of blocks in accordance with one embodiment.

FIG. 4 is a flow diagram illustrating a process 700 performed by the data retention module 148 for updating a LRU list used in a data retention operation in accordance with one embodiment. In block 702, the process 700 is triggered by a new memory operation (e.g. a new host write or a garbage collection operation). Then in block 704, the process determines if the new memory operation is a write operation or an erase operation. If it is a write operation, the update process 700 records the validity change caused by the new memory operation by moving an entry referencing the written block to the bottom of the LRU list in block 706. If it is an erase operation, the process records the validity change caused by the new memory operation by removing the entry referencing the erased block from the LRU list in block 708. If the same block is written to in the future, it will be added back into the LRU list (at the bottom of the list). In another embodiment, no change to the list is made in block 708.

Figure 5:
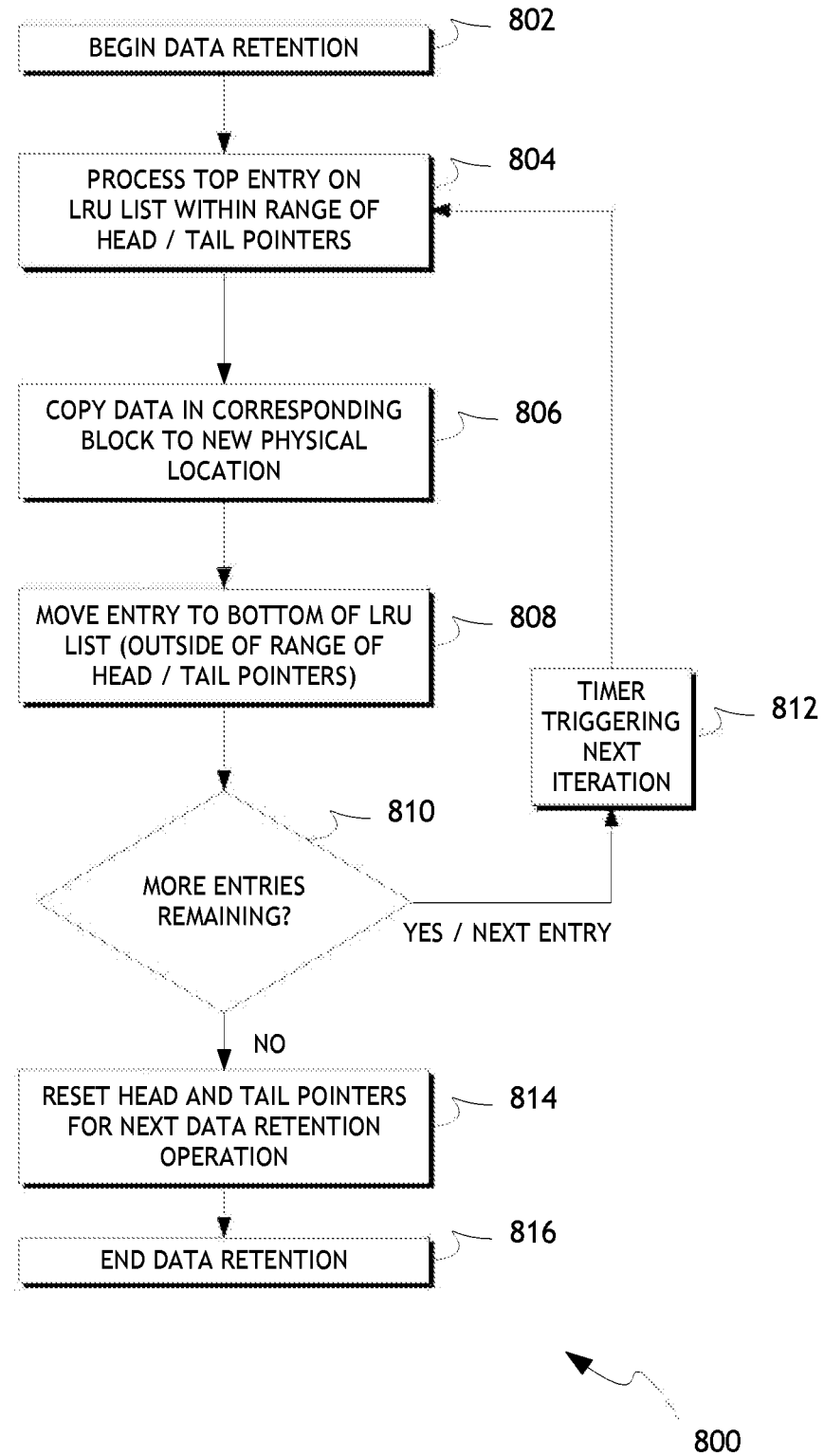
FIG. 5 is a flow diagram illustrating a process of performing data retention with a least recently used list of blocks in accordance with one embodiment.

FIG. 5 is a flow diagram illustrating a process 800 performed by the data retention module 148 for performing data retention with a least recently used list (or table) of blocks in accordance with one embodiment. The process 800 begins at block 802. Then in block 804, the top entry on the LRU list within range of the head and tail pointers is processed. The head and tail pointers (218 and 220) were previously shown in FIG. 1B, and as discussed above, mark the range of blocks that will undergo the data retention operation. In block 806, the process 800 copies data in the corresponding block referenced by the particular entry in the LRU list to a new physical location. Then in block 808, the entry is moved to the bottom of the LRU list, which may be outside of the range of the head and tail pointers. The process 800 then determines if there are additional entries remaining between the head and tail pointers, and if so, proceeds to the next entry at block 804. Optionally, a timer may be used to trigger the next iteration in block 812. In one embodiment, each refresh cycle is timed to ensure all refresh operations for the blocks complete with a time period set in accordance with a manufacturer warranty and/or specification. The time period can be, for example, three months, six months, one year, etc. Once the entries between the head and tail pointers are processed, the process in block 814 moves or sets the locations of the head and tail pointers for the next data retention operation. In one embodiment, the head pointer is moved to the entry after the previous location of the tail pointer and the tail pointer is moved to the end of the table. The operation ends in block 816.

In various embodiments, the different data retention operations described above may be modified. For example, the data retention module may switch among the different types of data retention operations or perform operations that use more than one data structure described above (e.g. using both the LRU list and the validity data bit arrays).

CONCLUSION

The features and attributes of the specific embodiments disclosed above may be combined in different ways to form additional embodiments, all of which fall within the scope of the present disclosure. Although the present disclosure provides certain embodiments and applications, other embodiments that will be apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A storage subsystem, comprising:
a non-volatile solid-state memory array; and
a controller comprising a data retention module, the data retention module configured to:
issue a plurality of copy commands for copying data stored in physical memory locations, within the non-volatile solid-state memory array, that are selected by the data retention module; and
maintain usage data on the storage subsystem,
wherein the data retention module is further configured to:
issue the plurality of copy commands so that the data in the selected physical memory locations are copied at least once within a first period of time determined by the data retention module based on the usage data, and in response to determining that a first rate of executing the plurality of copy commands is insufficient for executing a remaining number of copy commands from the plurality of copy commands within the first time period, the data retention module is further configured to modify the first rate to obtain a second rate at which the remaining number of copy commands are executed, the second rate based at least in part on the remaining number of copy commands and a remaining length of time from the first period of time.

2. The storage subsystem of claim 1, wherein the plurality of copy commands are issued independently of a command issued by a host system from which the storage subsystem is configured to receive commands.

3. The storage subsystem of claim 1, wherein the selected physical memory locations comprise physical memory locations for the entire non-volatile solid-state memory array.

4. The storage subsystem of claim 3, wherein each of the plurality of copy commands is issued periodically in a time interval determined by dividing the first period of time by a number of physical memory locations in the non-volatile solid-state memory array.

5. The storage subsystem of claim 1, wherein the usage data comprises an amount of time during which the storage subsystem is powered on.

6. The storage subsystem of claim 1, wherein the usage data comprises a number of program and erase cycles that the non-volatile solid-state memory array has experienced.

7. The storage subsystem of claim 1, wherein the data retention module is further configured to maintain a list of physical memory locations in the non-volatile solid-state memory sorted by a least recently used (LRU) criterion and use the list to select physical memory locations for the copy commands.

8. A storage subsystem, comprising:
a non-volatile solid-state memory array; and
a controller comprising a data retention module, the data retention module configured to:
identify a number of physical memory locations of the non-volatile solid-state memory array with data to be refreshed at least once within a first period of time;
issue a number of copy commands for copying the data stored in the physical memory locations;
execute at least some of the number of copy commands at an execution rate;
maintain usage data on the storage subsystem; and
in response to determining that the execution rate is insufficient to execute the number of copy commands within the first period of time, adjusting the pace of executing the number of copy commands based at least in part on a remaining number of copy commands from the number of copy commands and a remaining length of time from the first period of time.

9. The storage subsystem of claim 8, wherein the first period of time is determined based on the usage data of the storage subsystem.

10. The storage subsystem of claim 8, wherein the execution rate is based at least in part on the number of copy commands and the length of the first period of time.

11. The storage subsystem of claim 8, wherein the data retention module is further configured to prioritize execution of the remaining number of copy commands from the number of copy commands in response to determining that the remaining length of time from the first period of time is insufficient to complete execution of the remaining number of copy commands within the first period of time.

12. The storage subsystem of claim 8, wherein the data retention module is further configured to execute the at least some of the number of copy commands when the non-volatile solid-state memory array is idle.

13. The storage subsystem of claim 8, wherein the data retention module is further configured to delay execution of a copy command from the at least some of the number of copy commands in response to the controller prioritizing a command associated with a higher priority than the copy command.

14. A method of retaining data in non-volatile solid-state memory, the method comprising:
identifying a number of physical memory locations of the non-volatile solid-state memory with data to be refreshed at least once within a first period of time;
issuing a number of copy commands for copying the data stored in the physical memory locations;
executing at least some of the number of copy commands at a first rate; and
in response to determining that the first rate is insufficient to execute the number of copy commands within the first period of time, adjusting the pace of executing the number of copy commands to a second rate based at least in part on a remaining number of copy commands from the number of copy commands and a remaining length of time from the first period of time.

15. The method of claim 14, further comprising maintaining usage data on a storage subsystem which comprises the non-volatile solid-state memory, wherein the first period of time is determined based on the usage data of the storage subsystem.

16. The method of claim 14, wherein the first rate is based at least in part on the number of copy commands and the length of the first period of time.

17. The method of claim 14, further comprising prioritizing execution of the remaining number of copy commands from the number of copy commands in response to determining that the remaining length of time from the first period of time is insufficient to complete execution of the remaining number of copy commands within the first period of time.

18. The method of claim 14, wherein the executing the at least some of the number of copy commands occurs when the non-volatile solid-state memory is idle.

19. The method of claim 14, further comprising delaying execution of a copy command from the at least some of the number of copy commands in response to prioritization of a command associated with a higher priority than the copy command.

* * * * *